(12) United States Patent
Park et al.

(10) Patent No.: US 8,071,978 B2
(45) Date of Patent: *Dec. 6, 2011

(54) ORGANIC ELECTROLUMINESCENT DEVICE COMPRISING POWER SUPPLY LINE ON SAME LAYER AS GATE LINE

(75) Inventors: Jae-Yong Park, Gyeonggi-do (KR); Kwang-Jo Hwang, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 1150 days.

This patent is subject to a terminal disclaimer.

(21) Appl. No.: 10/742,775

(22) Filed: Dec. 23, 2003

(65) Prior Publication Data

US 2004/0135520 A1    Jul. 15, 2004

(30) Foreign Application Priority Data

Dec. 26, 2002 (KR) .................. 10-2002-0084578

(51) Int. Cl.
*H01L 27/12* (2006.01)
*H01L 27/32* (2006.01)
*H01L 29/04* (2006.01)
*H01L 29/16* (2006.01)
*H01L 29/786* (2006.01)

(52) U.S. Cl. .......... 257/59; 257/E27.112; 257/E29.003; 257/E29.291

(58) Field of Classification Search .............. 257/40, 257/59, E33.004, E33.055, E33.062, E33.063, 257/E33.064, E33.065, 57, 66, 72, E27.001, 257/E27.009, E27.111, E27.112, E27.117, 257/E27.12, E27.121, E29.001, E29.002, 257/E29.003, E29.068, E29.082, E29.083, 257/E29.105, E29.166, E29.169, E29.226, 257/E29.242, E29.255, E29.273, E29.285, 257/E29.288, E29.29, E29.291; 257/E33.001, 257/E33.002, E33.013; 438/22, 23, 28, 99

See application file for complete search history.

(56) References Cited

U.S. PATENT DOCUMENTS

| | | | |
|---|---|---|---|
| 5,920,083 A * | 7/1999 | Bae | 257/59 |
| 6,008,065 A | 12/1999 | Lee et al. | |
| 6,163,356 A | 12/2000 | Song et al. | |
| 6,175,345 B1 | 1/2001 | Kuribayashi et al. | |
| 6,215,244 B1 | 4/2001 | Kuribayashi et al. | |
| 6,287,899 B1 | 9/2001 | Park et al. | |
| 6,548,961 B2 | 4/2003 | Barth et al. | |
| 6,555,876 B2 * | 4/2003 | Jun et al. | 257/350 |
| 6,885,110 B1 * | 4/2005 | Ogawa | 257/798 |

(Continued)

FOREIGN PATENT DOCUMENTS

EP       0 709 718 A2    5/1996

(Continued)

*Primary Examiner* — Samuel Gebremariam
*Assistant Examiner* — Andrew O. Arena
(74) *Attorney, Agent, or Firm* — Morgan, Lewis & Bockius LLP

(57) ABSTRACT

An organic electroluminescent device includes first and second substrates spaced apart from and facing each other, an organic electroluminescent diode on an inner surface of the second substrate, a gate line formed on an inner surface of the first substrate in a first direction, a data line formed in a second direction crossing the first direction, a power supply line spaced apart from the data line and formed in the second direction, a switching thin film transistor at a crossing portion of the gate and data lines, a driving thin film transistor at a crossing portion of the switching thin film transistor and the power supply line, a connecting electrode connected to the driving thin film transistor, and an electrical connecting pattern corresponding to the connecting electrode and for electrically connecting the connecting electrode to the organic electroluminescent diode.

15 Claims, 20 Drawing Sheets

U.S. PATENT DOCUMENTS

| | | | |
|---|---|---|---|
| 6,911,670 B2 * | 6/2005 | Kim et al. | 257/72 |
| 6,984,847 B2 * | 1/2006 | Park et al. | 257/40 |
| 7,005,677 B2 * | 2/2006 | Park et al. | 257/72 |
| 7,232,702 B2 * | 6/2007 | Park et al. | 438/82 |
| 7,247,878 B2 * | 7/2007 | Park et al. | 257/40 |
| 2001/0017372 A1 | 8/2001 | Koyama | |
| 2002/0024096 A1 | 2/2002 | Yamazaki et al. | 257/359 |
| 2002/0050795 A1 | 5/2002 | Imura | 315/169.3 |
| 2002/0074549 A1 * | 6/2002 | Park et al. | 257/59 |
| 2002/0079494 A1 * | 6/2002 | Kim et al. | 257/72 |
| 2002/0158577 A1 | 10/2002 | Shimoda et al. | |
| 2003/0201445 A1 | 10/2003 | Park et al. | 257/79 |
| 2003/0205763 A1 | 11/2003 | Park et al. | 257/359 |
| 2004/0097161 A1 * | 5/2004 | Gourlay | 445/24 |
| 2006/0088875 A1 * | 4/2006 | Jackson et al. | 435/6 |

FOREIGN PATENT DOCUMENTS

| | | |
|---|---|---|
| EP | 08883191 | 12/1998 |
| EP | 1 220 187 | 9/2000 |
| JP | 1-219722 | 9/1989 |
| JP | 3-156427 | 7/1991 |
| JP | 4-31299 U | 3/1992 |
| JP | 04-280231 | 10/1992 |
| JP | 08-122821 | 5/1996 |
| JP | 8-146462 | 6/1996 |
| JP | 09-171197 | 6/1997 |
| JP | 10-282528 | 10/1998 |
| JP | 11-008065 | 1/1999 |
| JP | 2000-206571 | 7/2000 |
| JP | 2001-117509 | 4/2001 |
| JP | 2001-282123 | 10/2001 |
| JP | 2001-318624 | 11/2001 |
| JP | 2002-261201 | 9/2002 |
| KR | 2002-0047889 | 6/2002 |
| KR | 2004-0079476 | 9/2004 |
| WO | WO 01/01502 A2 | 1/2001 |
| WO | WO-02/078101 | 10/2002 |

* cited by examiner

ORGANIC ELECTROLUMINESCENT DEVICE COMPRISING POWER SUPPLY LINE ON SAME LAYER AS GATE LINE

The present invention claims the benefit of Korean Patent Application No. P2002-084578 filed in Korea on Dec. 26, 2002, which is hereby incorporated by reference.

BACKGROUND OF THE INVENTION

1. Field of the Invention

The present invention relates to a flat panel display device and more particularly, to an organic electroluminescent device and manufacturing method for the same.

2. Discussion of the Related Art

Liquid crystal display (LCD) devices have been most widely used in the field of flat panel display devices due to their lightweight and low power consumption. The liquid crystal display (LCD) device is not a light emitting element but rather a light-receiving element that needs an additional light source to display images. Accordingly, there is a technical limit in improving brightness, contrast ratio, viewing angle and enlarging the size of a liquid crystal display panel. For this reason, mush research has been ongoing in this field to develop a new flat panel display element that can overcome the aforementioned problems.

The organic electroluminescent device is one of the those new flat panel display elements. Because the organic electroluminescent device emits light, allows for a wide viewing angle and a large contrast ratio, the organic electroluminescent device is superior when compared to the liquid crystal display (LCD) device. In addition, an organic electroluminescent device does not need a backlight. Further, an organic electroluminescent device also has the advantages of being light weight, a thin profile and low power consumption. Moreover, the organic electroluminescent device can be driven with a low DC (direct current) and has a fast response time. Because the organic electroluminescent device uses a solid material instead of a fluid material, such as liquid crystal, an organic electroluminescent device is more stable if it receives an external impact. The solid material also has a wider range of operating temperatures as compared to liquid crystal.

The organic electroluminescent device also has an advantage in terms of production costs as compared to an LCD device. Specifically, a deposition apparatus and an encapsulation apparatus are all that is needed for manufacturing an organic electroluminescent device, while the liquid crystal display (LCD) device or Plasma display panels (PDPs) need many kind of apparatus. Thus, the manufacturing process for the organic electroluminescent device is very simple compared to the liquid crystal display (LCD) device or the plasma display panels (PDPs).

Organic electroluminescent devices may be classified into either a passive matrix-type device or an active matrix-type device. In the active matrix-type organic electroluminescent device, voltage applied to the pixel is also stored in a storage capacitor $C_{ST}$ such that the voltage is maintained until a signal for the next frame is applied. Accordingly, the pixel can retain the signal until the next frame regardless of the number of the scan lines. The active matrix-type organic electroluminescent device can obtain an appropriate luminance with low direct current (DC). Further, the active matrix-type organic electroluminescent device has advantages, such as low power consumption and high resolution with a large screen size. A basic structure and an operational property of the active matrix-type organic electroluminescent device will be described hereinafter with reference to FIG. 1.

FIG. 1 is a circuit diagram of a pixel of a related art active matrix organic electroluminescent device. A basic structure and an operational property of the active matrix-type organic electroluminescent device will be described hereinafter with reference to FIG. 1. As shown in FIG. 1, a scan line 2 is formed in a first direction while signal and power supply lines 4 and 6, formed apart from each other and crossing the scan line 2, are formed in a second direction. The scan line 2 together with the signal and power supply lines 4 and 6 define a pixel region. A switching thin film transistor $T_S$, such as an addressing element, is formed near an intersection of the scan and signal lines 2 and 4, and a storage capacitor $C_{ST}$ is connected to the switching thin film transistor $T_S$. A driving thin film transistor $T_D$, such as a current source element, is connected to the switching thin film transistor $T_S$, the storage capacitor $C_{ST}$ and the power supply line 6. The driving thin film transistor $T_D$ is electrically connected to an anode electrode of an organic electroluminescent diode E that is driven by a static current. The anode electrode as well as the cathode electrode are components of the organic electroluminescent diode E. The switching thin film transistor $T_S$ serves to control a voltage applied to the driving thin film transistor $T_S$ and the storage capacitor $C_{ST}$ serves to store a charge to maintain the voltage applied to the driving thin film transistor $T_S$. The driving principle of the related art organic electroluminescent device will be described hereinafter.

When the switching thin film transistor $T_S$ is turned on, a data signal can be applied to the driving thin film transistor $T_D$ and the storage capacitor $C_{ST}$ via the switching thin film transistor $T_S$. When the driving thin film transistor $T_D$ is turned on, a current from the power supply line 6 can be applied to the organic electroluminescent diode E. The current passing through the driving thin film transistor $T_D$ then passes through the organic electroluminescent diode E such that the organic electroluminescent diode E can emit light. Because the degree in which driving thin film transistor $T_D$ is open depends on amplitude of the data signal, gray levels can be displayed by controlling an amount of current that passes through the driving thin film transistor $T_D$. A data signal that is stored in the storage capacitor $C_{ST}$ is continuously applied to the driving thin film transistor $T_D$ and accordingly the organic electroluminescent diode E can continuously emit light at a specified gray level until a signal for a next frame is applied.

FIG. 2 is a plan view of a pixel of a related art active matrix organic electroluminescent device. As shown FIG. 2, the pixel includes a switching thin film transistor $T_S$ and a driving thin film transistor $T_D$. As also shown in FIG. 2, a gate line 37 is formed in a first direction, and a data line 51 and a power supply line 41, which are spaced apart from each other, are formed in a second direction. The gate line 37 crosses the data line 51 and the power supply line 41 and defines a pixel region P between the gate line 37, the data line 51 and the power supply line 41. A switching thin film transistor $T_S$ is formed near an intersection of the gate and the data lines 37 and 51 and a driving thin film transistor $T_D$ is formed near an intersection of the switching thin film transistor $T_S$ and the power supply line 41. The power supply line 41 and a capacitor electrode 34, which is connected to a semiconductor layer 31 of the switching thin film transistor $T_S$, form a storage capacitor $C_{ST}$. A first electrode 58 is electrically connected to the driving thin film transistor $T_D$. Although not shown in FIG. 2, an organic light emitting layer and a second electrode are sequentially formed over the first electrode 58. The area where the first electrode 58 is formed is defined as an organic light-emitting region L. The driving thin film transistor $T_D$ has a semiconductor layer 32 and a gate electrode 38. The switching thin film transistor $T_S$ has a gate electrode 35. Layered structures of the organic light-emitting region L, the driving thin film transistor $T_D$ and the storage capacitor $C_{ST}$ will be described hereinafter with reference to FIG. 3.

FIG. 3 is a cross-sectional view along the line III-III' of FIG. 2. In FIG. 3, a driving thin film transistor $T_D$ having a semiconductor layer 32, a gate electrode 38, and source and drain electrodes 50 and 52 is formed on an insulating substrate 1. A power electrode 42 extending from a power supply line (not shown) is electrically connected to the source electrode 50 and a first electrode formed of transparent conductive material is electrically connected to the drain electrode 52. A capacitor electrode 34 is formed under the power electrode 42 of the same material used to form the semiconductor layer 32. The power electrode 42 and the capacitor electrode 34 form a storage capacitor $C_{ST}$. An organic light-emitting layer 64 and a cathode electrode 66 are sequentially formed on the first electrode 58 to complete formation of an organic light-emitting region L. A buffer layer 30 is formed between the substrate 1 and the semiconductor layer 32. First, second, third and fourth passivation layers 40, 44, 54 and 60 respectively having a contact hole for electrical contacting in each layer are formed on the substrate 1. The first passivation layer 40 is formed between the storage electrode 34 and the power electrode 42 and serves as a dielectric substance. The second passivation layer 44 is formed on the power electrode 42 and the third passivation layer 54 is formed between the source electrode 50 and the first electrode 58. The fourth passivation layer 60 is formed between the driving thin film transistor $T_D$ and a second electrode 66.

FIGS. 4A to 4I are cross-sectional views illustrating processes of fabricating the related art active matrix organic electroluminescent device, and correspond to cross-sections along the line III-III' of FIG. 2. The organic electroluminescent device may be manufactured using a photolithographic process in which thin films are patterned by exposing and then developing a photoresist, such as a photosensitive material. As shown in FIG. 4A, a buffer layer 30 is formed on an insulating substrate 1 with a first insulating material. Then, a semiconductor layer 32 and a capacitor electrode 34 are formed of polycrystalline silicon on the buffer layer 30 through a first photolithography process using a first mask.

Subsequently as shown in FIG. 4B, a gate insulating layer 36 and a gate electrode 38 are formed on the semiconductor layer 32 by sequentially depositing a second insulating material and a first metal material on the semiconductor layer 32 and then patterning the deposited material through a second photolithography process using a second mask. Then, as shown in FIG. 4C, a first passivation layer 40 is formed on the whole substrate on which the gate insulating layer 36 and the gate electrode 38 are already formed. A power electrode 42 is subsequently formed on the first passivation layer 40 in an area corresponding to the capacitor electrode 34 by depositing a second metal material on the first passivation layer 40 and then patterning it through a third photolithography process using a third mask.

As shown in FIG. 4D, a second passivation layer 44 having first and second contact holes 46a and 46b and a capacitor contact hole 48 is formed in the first passivation layer 40 by depositing a third insulating material on the first passivation layer 40 and then patterning it through a fourth photolithography process using a fourth mask. The first and second contact holes 46a and 46b expose portions at both sides of the semiconductor layer 32 and the capacitor contact hole 48 exposes a portion of the power electrode 42. The semiconductor layer 32 is doped with impurities such as boron (B) or phosphorus (P) to define a channel region 32a corresponding to the gate electrode 38, and source and drain regions 32b and 32c at both sides of the channel region 32a.

As shown in FIG. 4E, source and drain electrodes 50 and 52 are subsequently formed on the second passivation layer 44 by depositing a third metal material and then patterning it through a fifth photolithography process using a fifth mask. The source electrode 50 is connected to the source region 32b through the first contact hole 46a and is connected to the power electrode 42 via the capacitor contact hole 48. The drain electrode 52 is connected to the drain region 32c via the second contact hole 46b. The semiconductor layer 32, the gate electrode 38 and the source and drain electrodes 50 and 52 form a driving thin film transistor $T_D$. The power electrode 42 and the capacitor electrode 34 are electrically connected to the source electrode 52 and a semiconductor layer (not shown) of a switching thin film transistor (not shown), respectively and form a storage capacitor $C_{ST}$ using the first passivation layer 40 as a dielectric substance.

Referring to FIG. 4F, a third passivation layer 54 having a drain contact hole 56 is formed by depositing a fourth insulating material over the whole substrate 1 on which the source and drain electrodes 50 and 52 are already formed and then patterning it through a sixth photolithography process using a sixth mask. As shown in FIG. 4G, a first electrode 58 is then formed on the third passivation layer 54 in an area corresponding to an organic light-emitting region L by depositing a fourth metal material on the third passivation layer 54 and then patterning it through a seventh photolithography process using a seventh mask. The first electrode 58 is connected to the drain electrode 52 through the drain contact hole 56.

Then, as shown in FIG. 4H, a fourth passivation layer 60 having a first electrode exposure portion 62 exposes a first electrode portion corresponding to the organic light-emitting region L formed by depositing a fifth insulating material over the whole substrate 1 on which the first electrode 58 is already formed and then patterning it through an eighth photolithography process using an eighth mask. The fourth passivation layer 60 also serves to protect the driving thin film transistor $T_D$ from moisture and contaminants.

As shown in FIG. 4I, an organic light-emitting layer 64 contacting the first electrode 58 via the first electrode exposure portion 62 is formed on the substrate 1 over which the fourth passivation layer 60 is already formed. A second electrode 66 is subsequently formed on the organic light-emitting layer 64 and the fourth passivation layer 60 by depositing a fifth metal material over the whole substrate 1. If the first electrode 58 is used as an anode electrode, the fifth metal material should have a reflection property so as to reflect the light emitted from the organic light-emitting layer 64 and thus to display an image. In addition, the fifth metal material is selected from the metal materials having a low work function such that the second electrode 66 can easily give away electrons.

FIG. 5 is a cross-sectional view of a related art organic electroluminescent device. As shown in FIG. 5, a first substrate 70 on which a plurality of sub-pixels $P_{sub}$ are defined and a second substrate 90 are spaced apart from each other. An array element layer 80 having a plurality of driving thin film transistors $T_D$ corresponding to each sub-pixel $P_{sub}$ is formed on the first substrate 70. A plurality of first electrodes 72 corresponding to each sub-pixel $P_{sub}$ is formed on the array element layer 80. The plurality of first electrodes 72 respectively connects to the driving thin film transistors $T_D$ of the sub-pixels $P_{sub}$. An organic light-emitting layer 74 for emitting light of either red (R), green (G) and blue (B) colors from the sub-pixels $P_{sub}$ is formed on the first electrode 72. A second electrode 76 is formed on the organic light-emitting layer 74. The first and second electrodes 72 and 76, and the organic light-emitting layer 74 form an organic electroluminescent diode E. Light emitted from the organic light-emitting layer 74 passes through the first electrode 72. That is, the organic electroluminescent device is a bottom emission-type organic electroluminescent device.

The second substrate 90 is used as an encapsulating substrate and has a depressed portion 92 at a middle surface thereof and a moisture absorbent desiccant 94 for protecting the organic electroluminescent diode E from exterior moisture. The second substrate 90 is spaced apart from the second electrode 76 at a certain distance. A seal pattern 85 is formed on one of the first and second substrates 70 and 90 and later used to attach the first and second substrates 70 and 90.

Attaching the substrate having the array element layer and the organic electroluminescent diode to an additional encapsulating substrate completes the related art bottom emission-type organic electroluminescent device. If the array element layer and the organic electroluminescent diode are formed on the same substrate, then yield of a panel having the array element layer and the organic electroluminescent diode is dependent upon the individual yields of the array element layer and the organic electroluminescent diode. The yield of the panel is greatly affected by the yield of the organic electroluminescent diode. Accordingly, if an inferior organic electroluminescent diode that is usually formed of a thin film having a thickness of 1000 Å has a defect due to impurities and contaminants, the panel is classified as a defective panel. This leads to wasted production costs and material, thereby decreasing yield.

Bottom emission-type organic electroluminescent devices have the advantages of high image stability and variable fabrication processing. However, the bottom emission-type organic electroluminescent devices are not adequate for implementation in devices that require high resolution because bottom emission-type organic electroluminescent devices have a small aperture ratio due to the thin film transistor blocking some of the light transmission. Top emission-type organic electroluminescent devices have a large aperature ratio. In addition, since top emission-type organic electroluminescent devices emit light upward of the substrate, the light can be emitted without being blocked by the thin film transistor that is positioned under the light-emitting layer. Accordingly, design of the thin film transistor may be simplified in top emission-type organic electroluminescent device. In addition, the aperture ratio can be increased, thereby increasing operational life span of the organic electroluminescent device. However, since a cathode is commonly formed over the organic light-emitting layer in the top emission-type organic electroluminescent devices, material selection and light transmittance are limited such that light transmission efficiency is lowered. If a thin film-type passivation layer is formed to prevent a reduction of the light transmittance, the thin film passivation layer may fail to prevent infiltration of exterior air into the device.

SUMMARY OF THE INVENTION

Accordingly, the present invention is directed to an organic electroluminescent device and manufacturing method for the same that substantially obviate one or more of the problems due to limitations and disadvantages of the related art.

An object of the present invention is to provide an organic electroluminescent device that is manufactured at lower temperatures with reduced number of masking steps.

Another object of the present invention is to provide a manufacturing method for an organic electroluminescent device having lower temperatures and a reduced number of masking steps.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent device includes first and second substrates spaced apart from and facing each other, an organic electroluminescent diode on an inner surface of the second substrate, a gate line formed on an inner surface of the first substrate in a first direction, a data line formed in a second direction crossing the first direction, a power supply line spaced apart from the data line and formed in the second direction, the power supply line made of the same material as the gate line, the power supply line having a power supply link line near a crossing portion of the gate line and the power supply line, a switching thin film transistor at a crossing portion of the gate and data lines, the switching thin film transistor including a first semiconductor layer made of amorphous silicon, a driving thin film transistor at a crossing portion of the switching thin film transistor and the power supply line, the driving thin film transistor including a second semiconductor layer made of amorphous silicon, a connecting electrode connected to the driving thin film transistor and made of the same material as the data line, and an electrical connecting pattern corresponding to the connecting electrode and for electrically connecting the connecting electrode to the organic electroluminescent diode, wherein the switching thin film transistor and the driving thin film transistor further include first and second gate insulating layers, respectively, the first gate insulating layer having the same shape as the first semiconductor layer, the second gate insulating layer having the same shape as the second semiconductor layer.

In another aspect of the present invention, a method of manufacturing an array substrate for an organic electroluminescent device including an array element on a first substrate and an organic electroluminescent diode on a second substrate includes steps of forming a gate electrode, a gate pad, a power electrode and a power supply pad by depositing a first metal material on a substrate and then patterning the first metal material using a first mask process, forming a gate insulating layer, a semiconductor layer, a semiconductor material pattern, a first pattern and a second pattern by depositing a first insulating material, amorphous silicon and doped amorphous silicon on the substrate including the gate electrode, the gate pad, the power electrode and the power supply pad and patterning the first insulating material, the amorphous silicon and the doped amorphous silicon using a second mask process, wherein the semiconductor layer is disposed over the gate electrode and includes the amorphous silicon and the doped amorphous silicon, the semiconductor material pattern extends from the semiconductor layer and has a power electrode contact hole exposing the power electrode, the first pattern has a gate pad contact hole exposing the gate pad, and the second pattern has a power supply pad contact hole exposing the power supply pad, forming an electrical connecting pattern by depositing a second insulating material on the semiconductor layer, the semiconductor material pattern, the first pattern and the second pattern and then patterning the second insulating material using a third mask process, the electrical connecting pattern having a columnar shape and corresponding to the organic electroluminescent diode, forming a source electrode, a drain electrode, a connecting electrode, a data pad, a gate pad electrode and a power supply pad electrode by depositing a second metal material on the substrate including the electrical connecting pattern and then patterning the second metal material using a fourth mask process, wherein the source and drain electrodes are formed on the semiconductor layer and spaced apart from each other, the source electrode is connected to the power electrode via the power electrode contact hole, the connecting electrode extends from the drain electrode and covers the electrical connecting pattern, the gate pad electrode is connected to the gate pad via the gate pad contact hole, and the power supply pad electrode is connected to the power supply pad via the power supply pad contact hole, and wherein the gate electrode, the semiconductor layer, the source electrode, and the drain electrode form a thin film transistor, and forming a passivation layer having first, second, third and fourth openings by depositing a third insulating material on the substrate including the source electrode, the drain electrode, the connecting electrode, the data pad, the gate pad electrode and the power supply pad electrode and then patterning the third insulating material using a fifth mask process, wherein the first opening exposes the connecting electrode, the second opening exposes the data pad, the third opening exposes the gate pad electrode, and the fourth opening exposes the power supply pad electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Reference will now be made in detail to the illustrated embodiment of the present invention, which is illustrated in the accompanying drawings. A dual panel type organic electroluminescent device according to the present invention that will be described hereinafter is an active matrix top emission type device.

Figure 1:
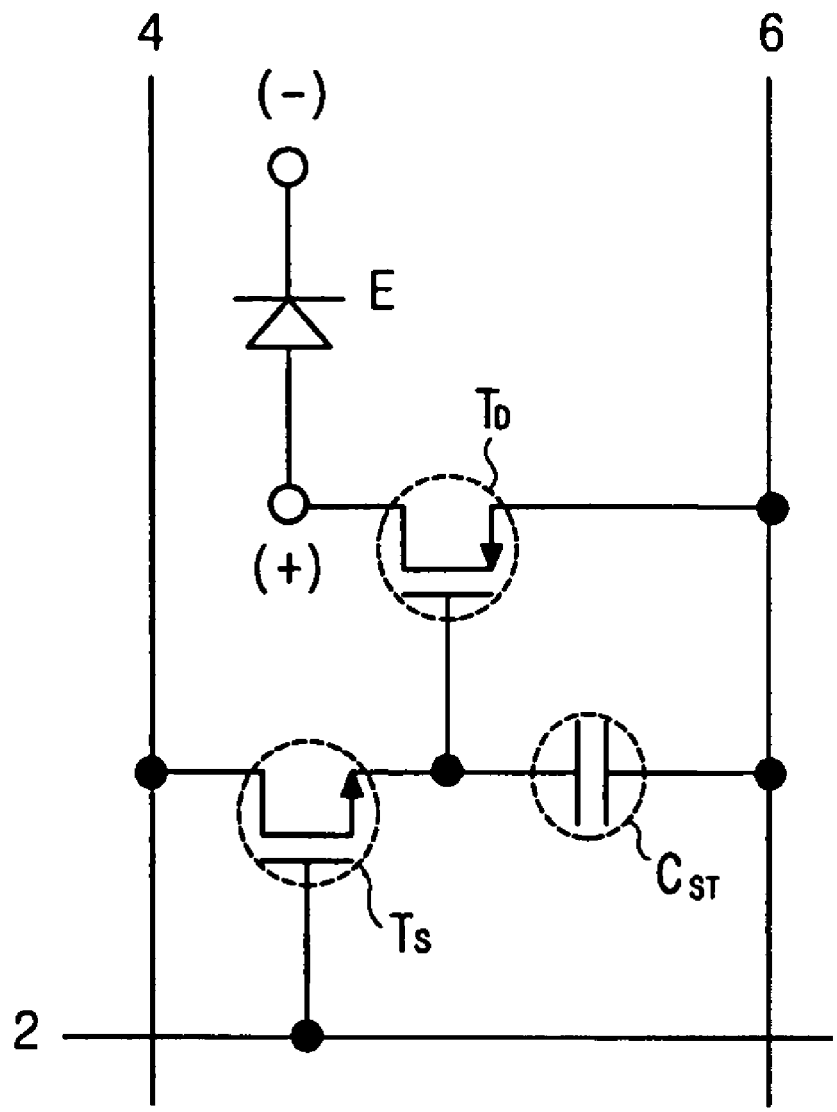
FIG. 1 is a circuit diagram of a pixel of a related art active matrix organic electroluminescent device.
Figure 2:
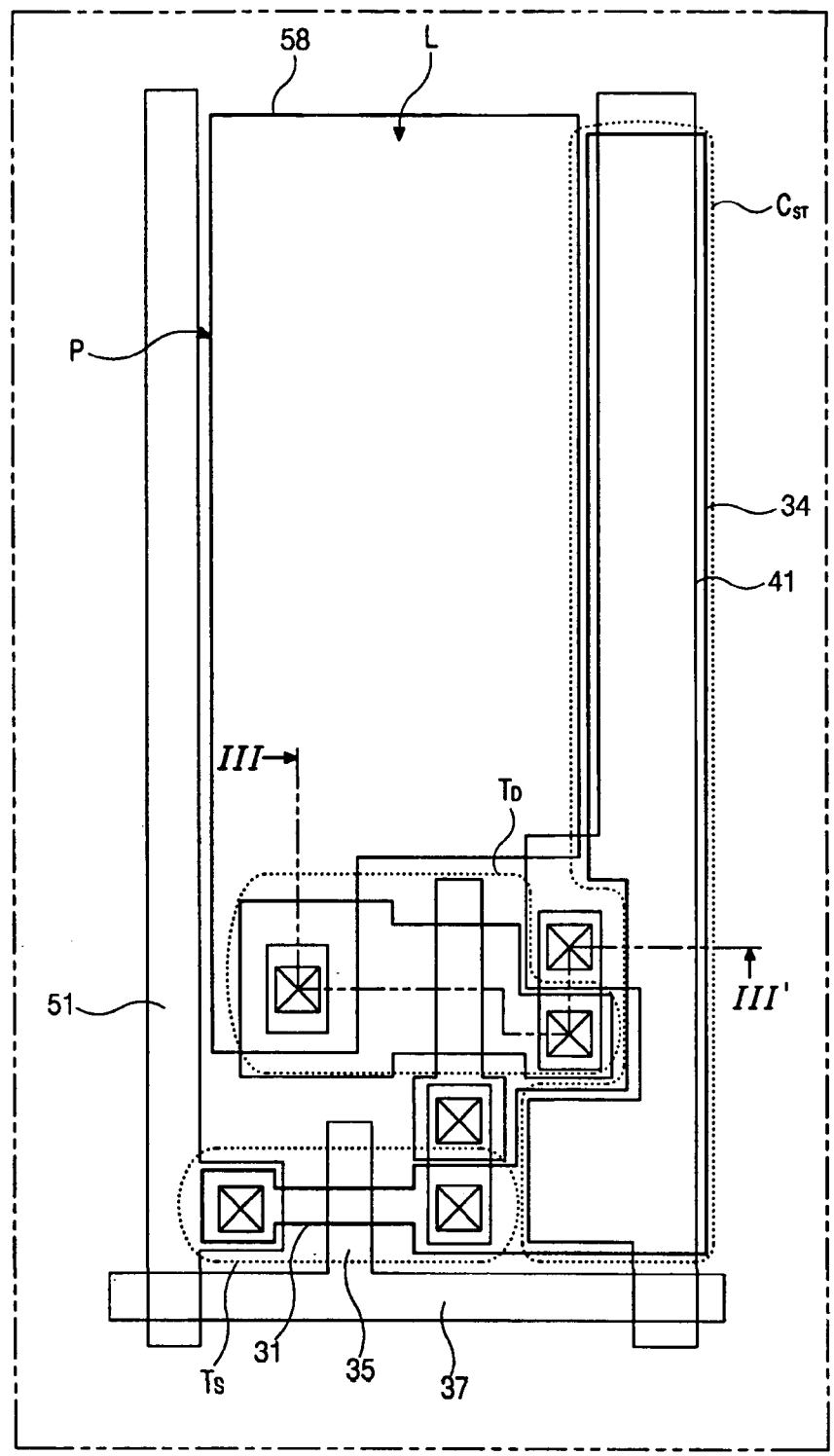
FIG. 2 is a plan view of a pixel of a related art active matrix organic electroluminescent device.
Figure 3:
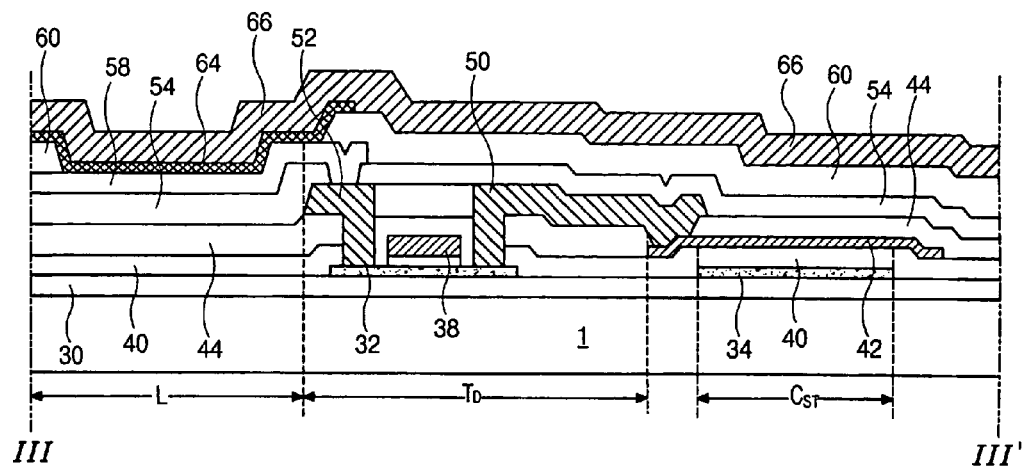
FIG. 3 is a cross-sectional view along the line III-III' of FIG. 2.
Figure 4A:
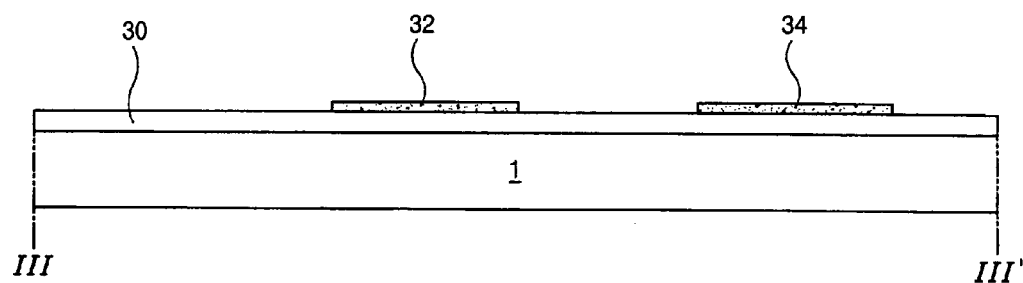
FIGS. 4A to 4I are cross-sectional views illustrating processes of fabricating the related art active matrix organic electroluminescent device and corresponding to cross-sections along the line III-III' of FIG. 2.
Figure 4B:
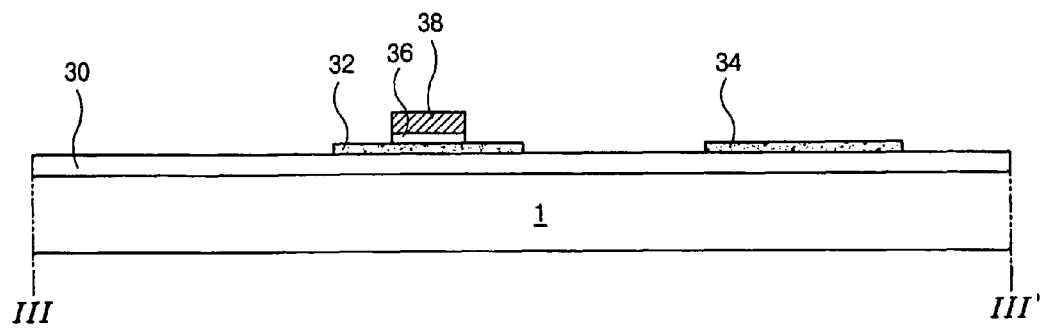
Figure 4C:
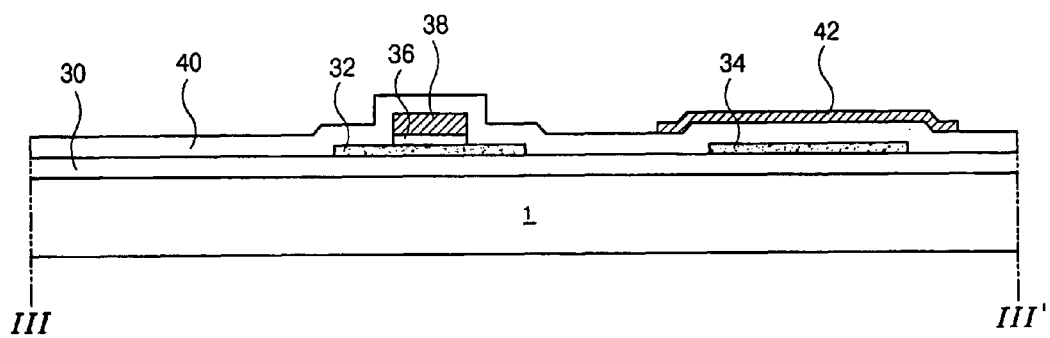
Figure 4D:
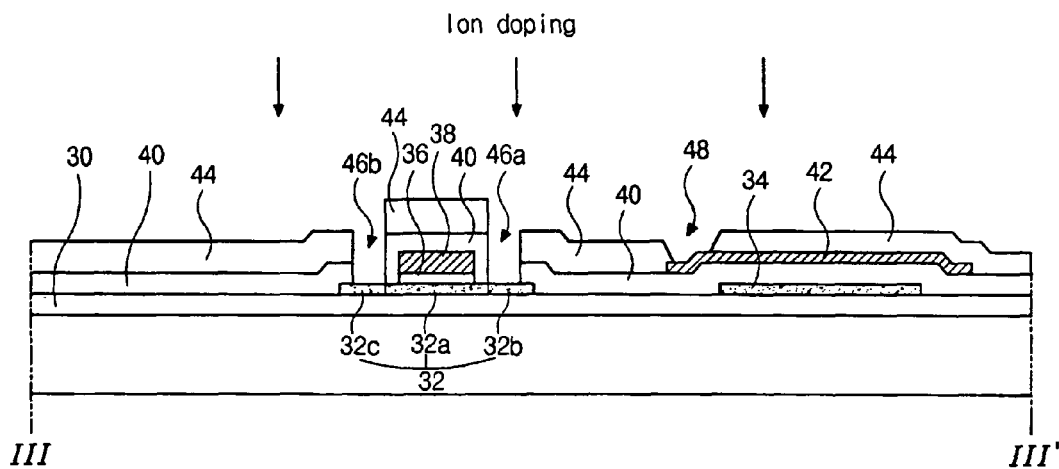
Figure 4E:
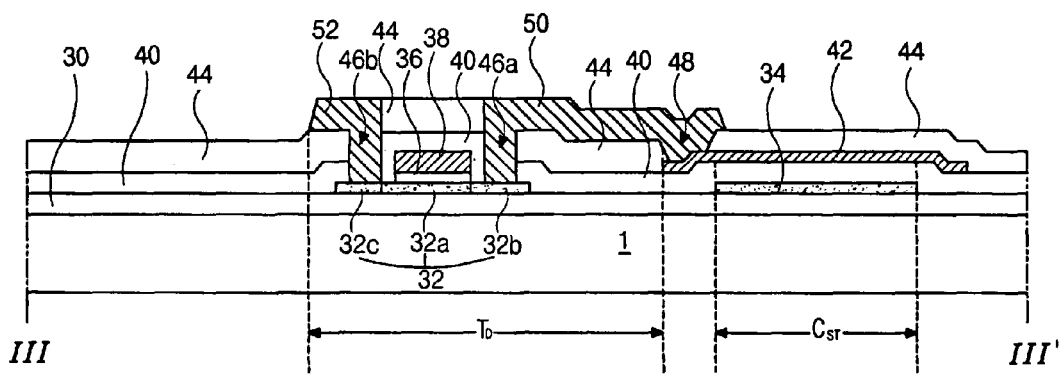
Figure 4F:
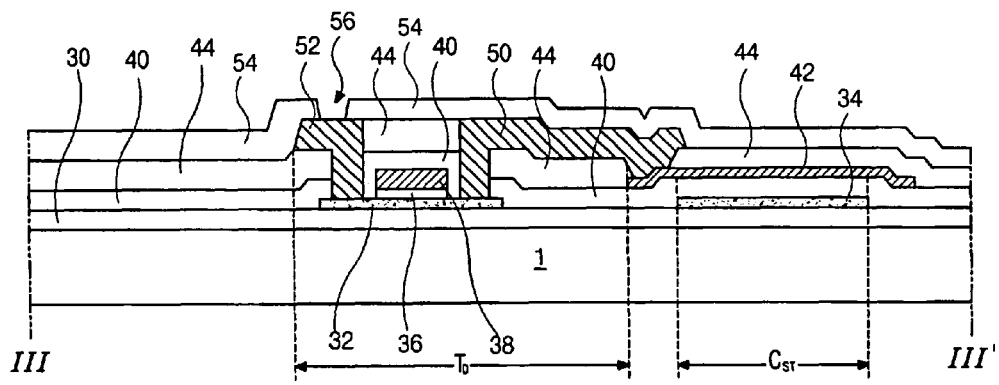
Figure 4G:
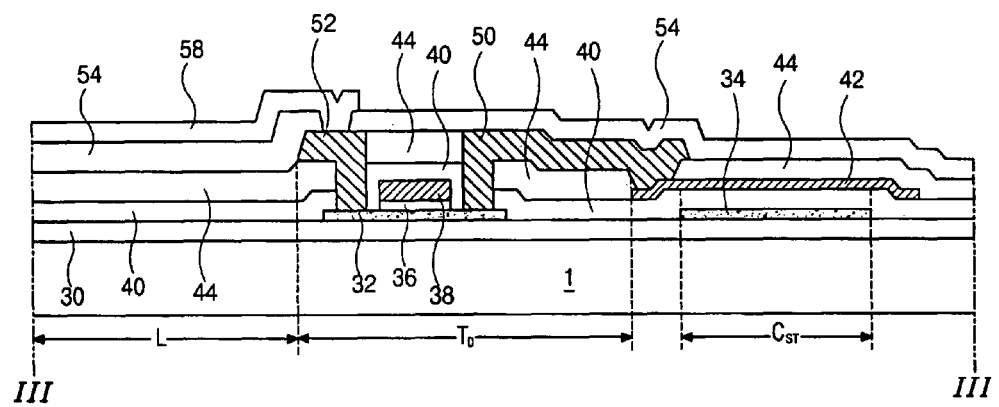
Figure 4H:
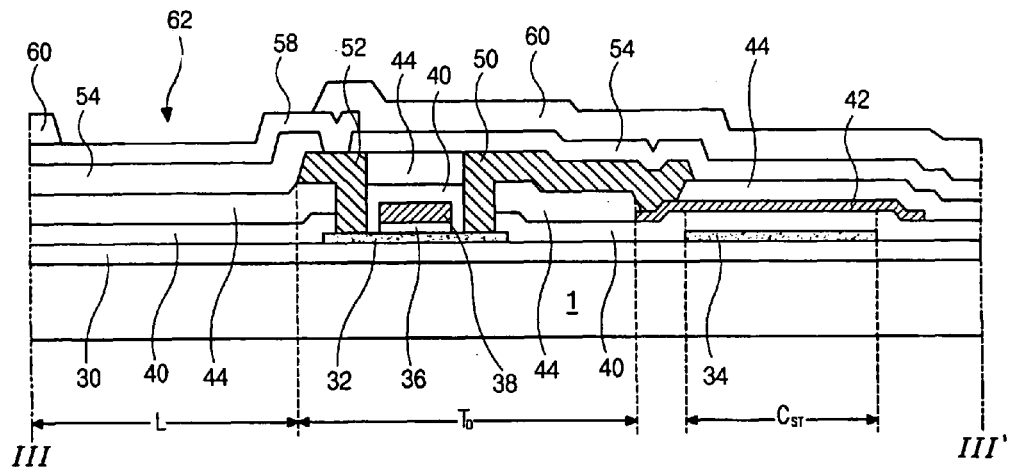
Figure 4I:
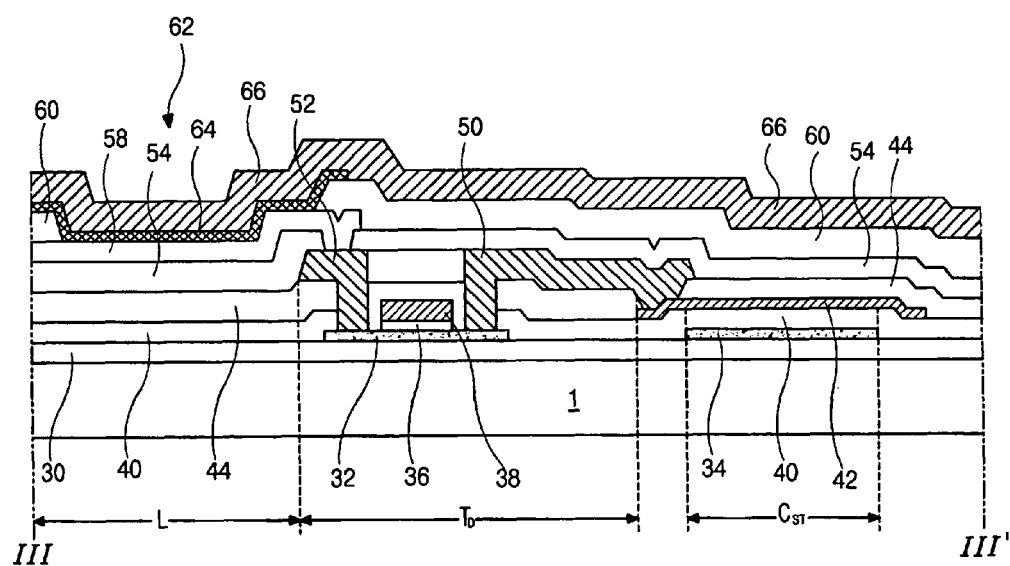
Figure 5:
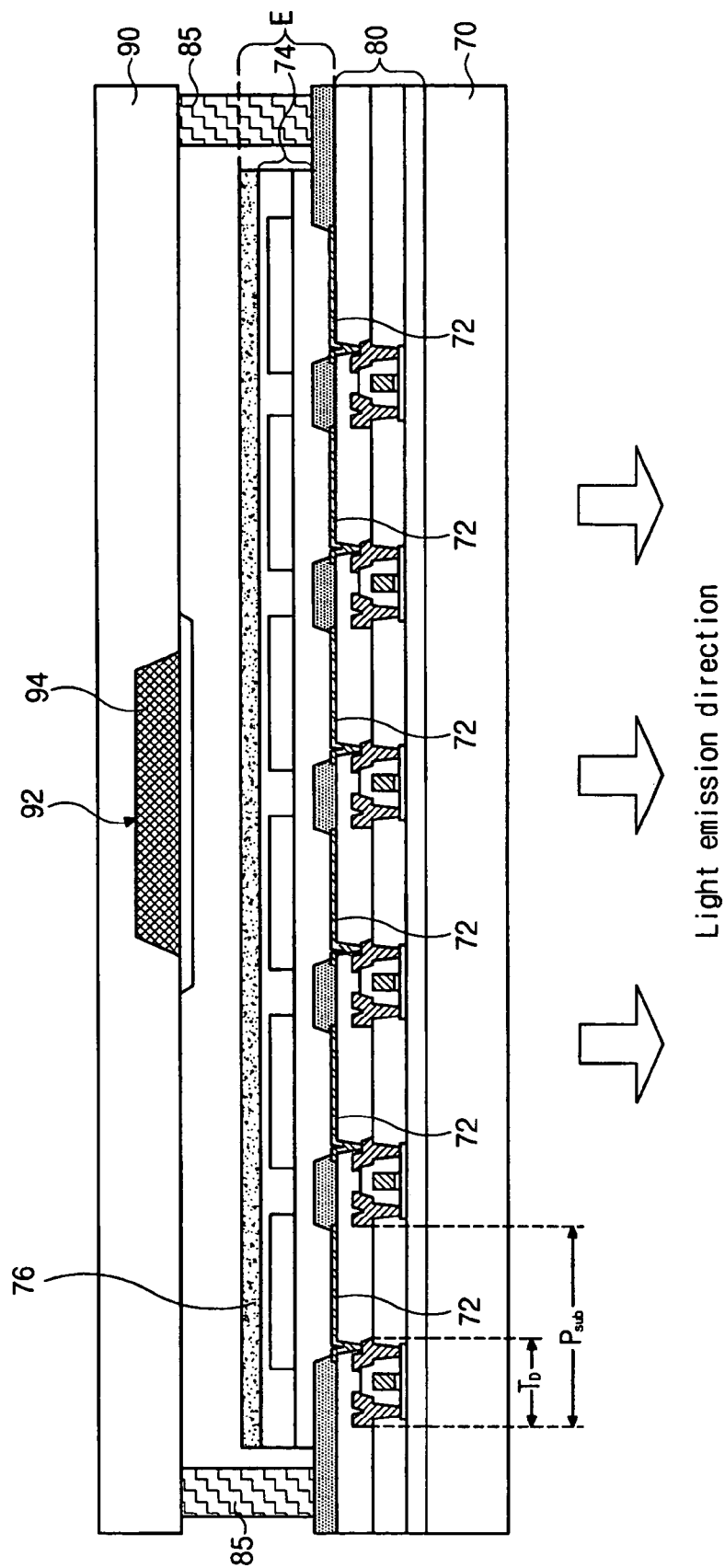
FIG. 5 is a cross-sectional view of a related art organic electroluminescent device.
Figure 6:
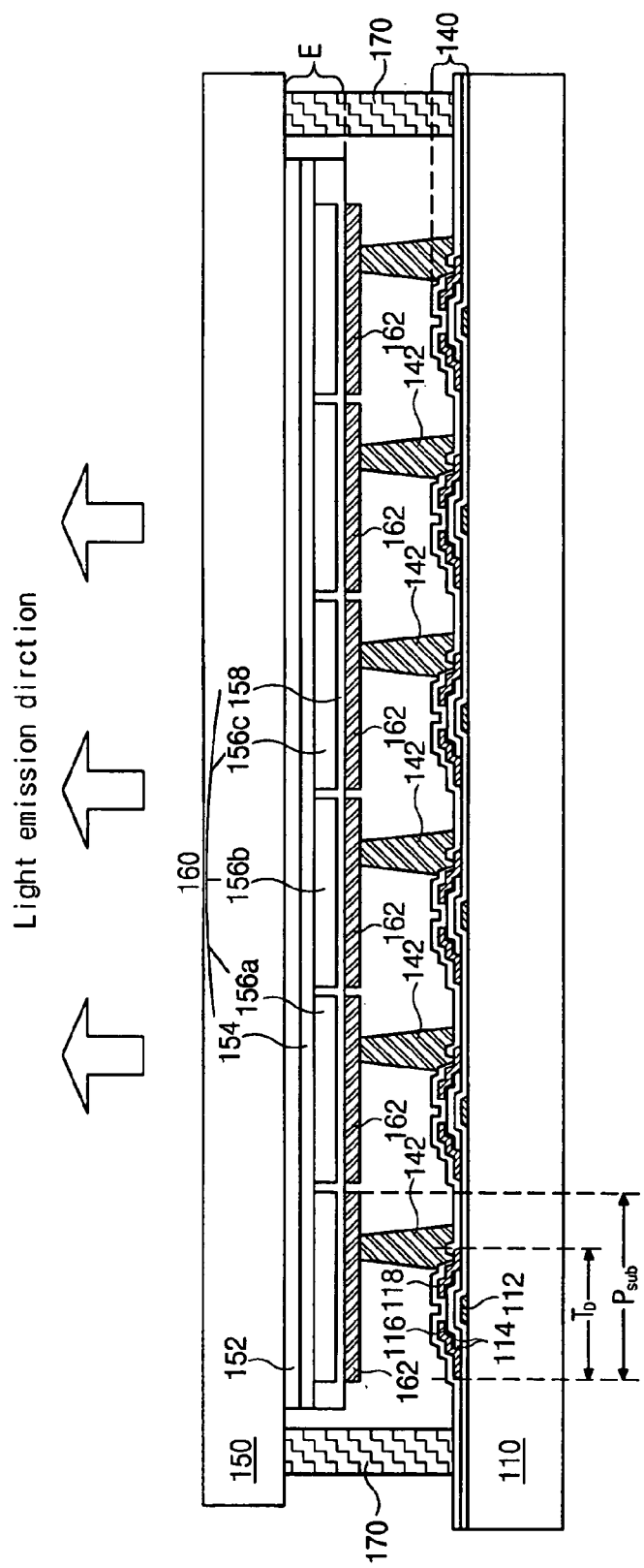
FIG. 6 is a cross-sectional view of a dual panel type organic electro-luminescent device according to an embodiment of the present invention.

FIG. 6 is a cross-sectional view of a dual panel type organic electroluminescent device according to an embodiment of the present invention. As shown in FIG. 6, a first substrate 110 and a second substrate 150 are spaced apart and facing each other. A plurality of sub-pixels $P_{sub}$ are defined on the first and second substrates 110 and 150. An array element layer 140 having a plurality of driving thin film transistors $T_D$ corresponding to each sub-pixel $P_{sub}$ is formed on the first substrate 110. An electrical connecting pattern 142 connected to the driving thin film transistor $T_D$ is formed on the array element layer 140. The electrical connecting pattern 142 is formed of conductive material and may be formed in a multi-layered structure including an insulating material considering its thickness. The electrical connecting pattern 142 may be electrically connected to the driving thin film transistor $T_D$ via an additional connecting electrode (not shown). The driving thin film transistor $T_D$ has a gate electrode 112, a semiconductor layer 114 and source and drain electrodes 116 and 118, and the electrical connecting pattern 142 is directly connected to the drain electrode 118.

A first electrode 152 is formed on an inner surface of the second substrate 150. An organic light-emitting layer 160 having sub-light emitting layers 156a, 156b and 156c respectively for red (R), green (G) and blue (B) colors is formed beneath the first electrode 152. A plurality of second electrodes 162 corresponding to each sub-pixel $P_{sub}$ is formed beneath the organic light-emitting layer 160. More specifically, the organic light-emitting layer 160 has a first carrier-delivering layer 154 between the first electrode 152 and the sub-light emitting layers 156a, 156b and 156c and a second carrier-delivering layer 158 between the sub-light emitting layers 156a, 156b and 156c and the second electrode 162. For example, if the first electrode 152 is an anode electrode and the second electrode 162 is a cathode electrode, the first carrier-delivering layer 154 serves as a hole injection layer and then a hole transporting layer, and the second carrier delivering layer 158 serves as an electron transporting layer and then an electron injection layer. The first and second electrodes 152 and 162 and the organic light-emitting layer 160 between the first and second electrodes 152 and 162 form an organic electroluminescent diode E. Because the electrical connecting pattern 142 contacts the bottom surface of the second electrode 162, current supplied from the driving thin film transistor $T_D$ can be applied to the second electrode 162 via the electrical connecting pattern 142. A seal pattern 170 is formed on one of the first and second substrates 110 and 150 such that the first and second substrates 110 and 150 can be attached to one another.

The array element layer 140 and the organic electroluminescent diode E are formed on different substrates and are electrically connected to each other by the electrical connecting pattern 142. That is, the organic electroluminescent device of the present invention is a dual panel type organic electroluminescent device. Only two pixels respectively having three sub-pixels are illustrated in FIG. 6 for convenience of an explanation. Further, the structure of the driving thin film transistor $T_D$ and a connecting method of the electrical connecting pattern 142 can be modified for many different conditions. In addition, because the organic electroluminescent device of the present invention is a top emission-type organic electroluminescent device, a driving thin film transistor $T_D$ design can be easily obtained while maintaining a high aperture ratio.

Figure 7:
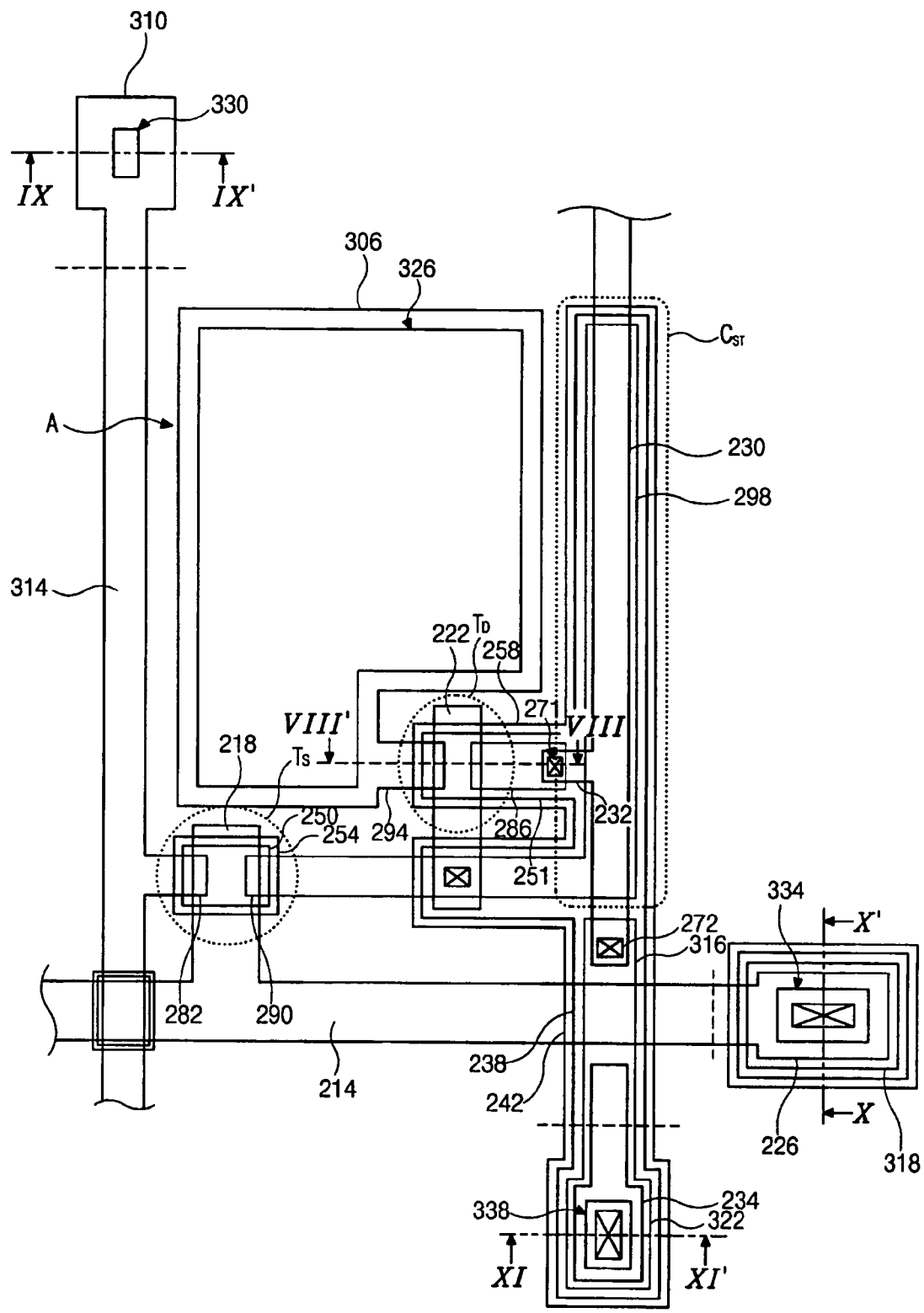
FIG. 7 is a plan view of an array substrate for a dual panel type organic electroluminescent device according to an embodiment of the present invention.
Figure 8A:
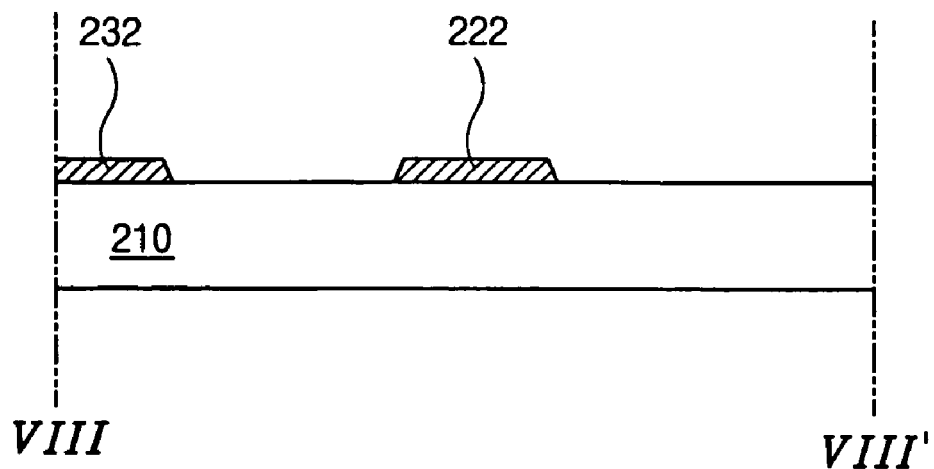
FIGS. 8A to 8E are cross-sectional views along the line VIII-VIII' of FIG. 7 and illustrating processes of fabricating an array substrate for the dual panel type organic electroluminescent device according to the embodiment of the present invention.
Figure 8B:
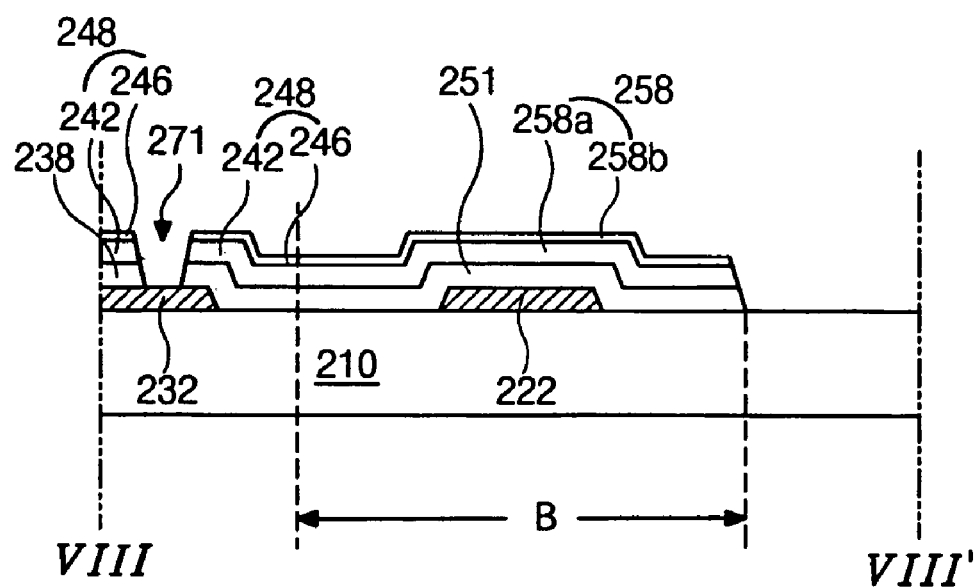
Figure 8C:
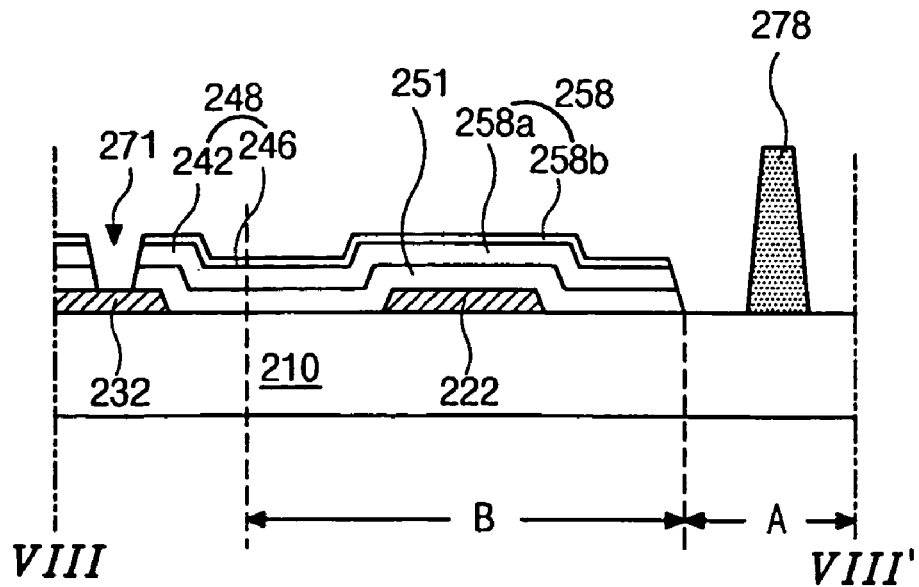
Figure 8D:
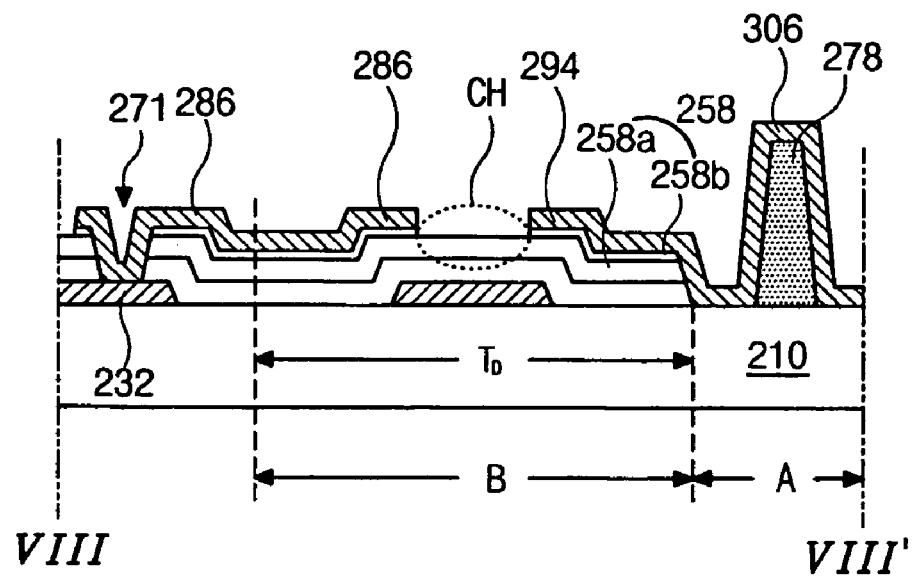
Figure 8E:
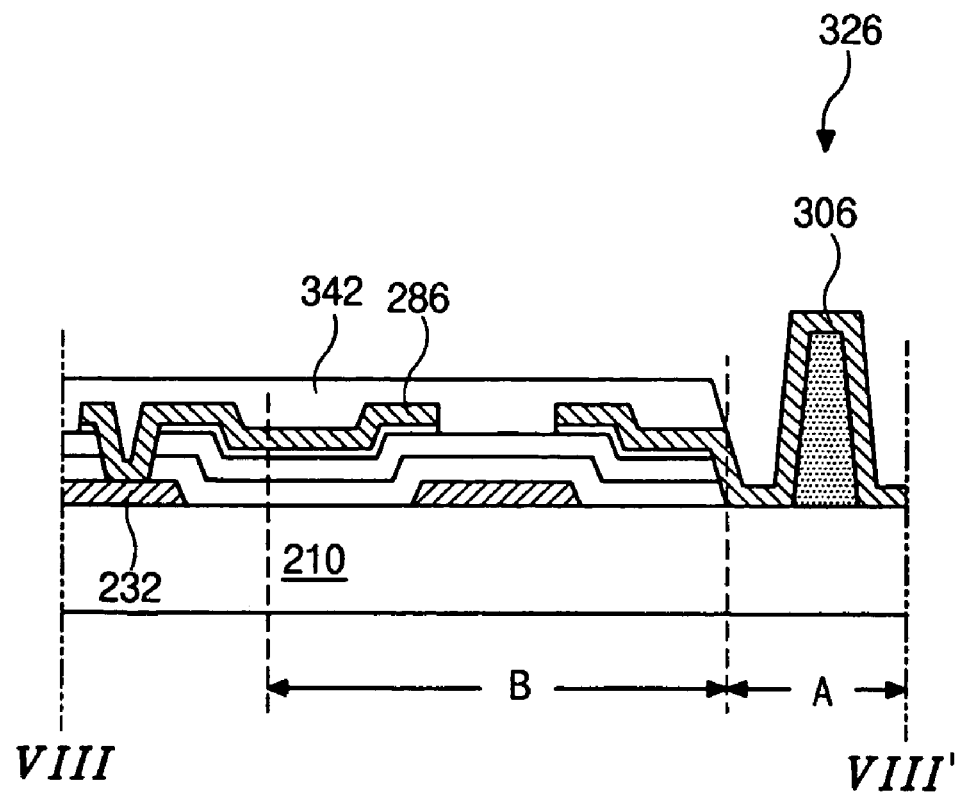
Figure 9A:
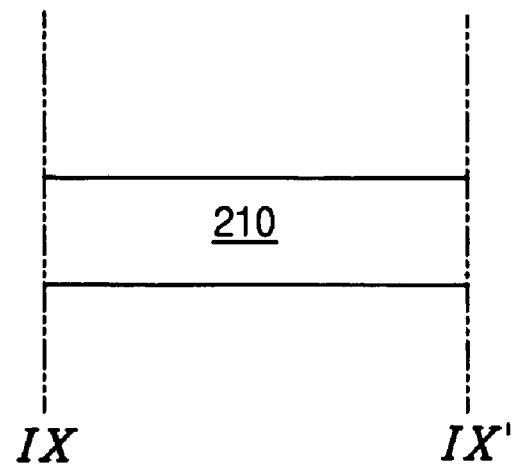
FIGS. 9A to 9E are cross-sectional views along the line IX-IX' of FIG. 7 and illustrating processes of fabricating an array substrate for the dual panel type organic electroluminescent device according to the embodiment of the present invention.
Figure 9B:
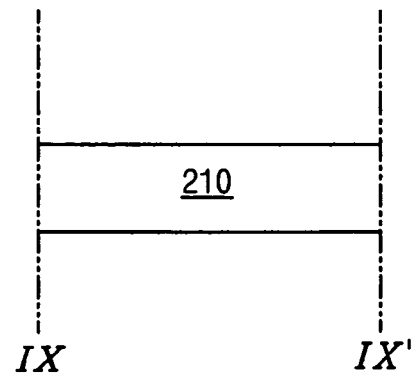
Figure 9C:
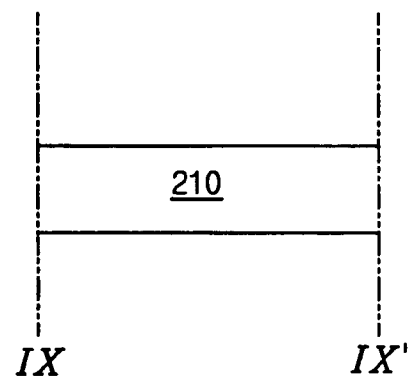
Figure 9D:
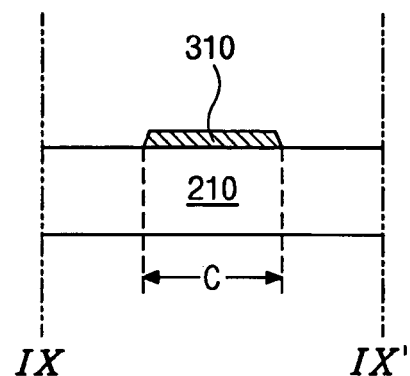
Figure 9E:
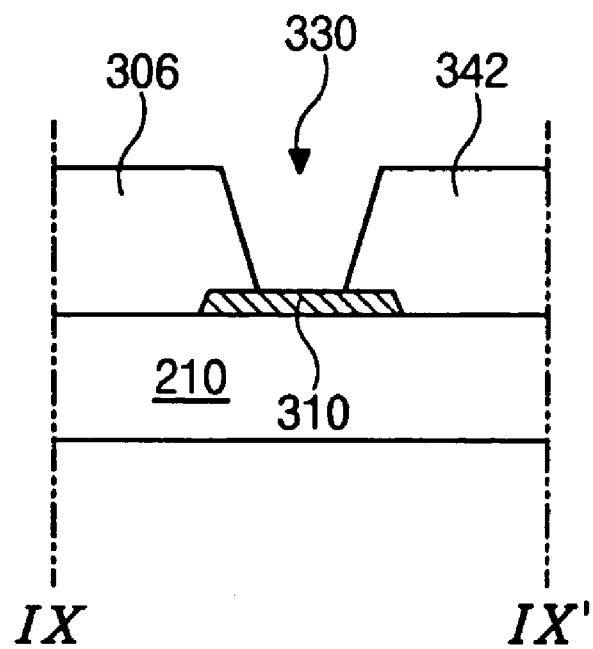
Figure 10A:
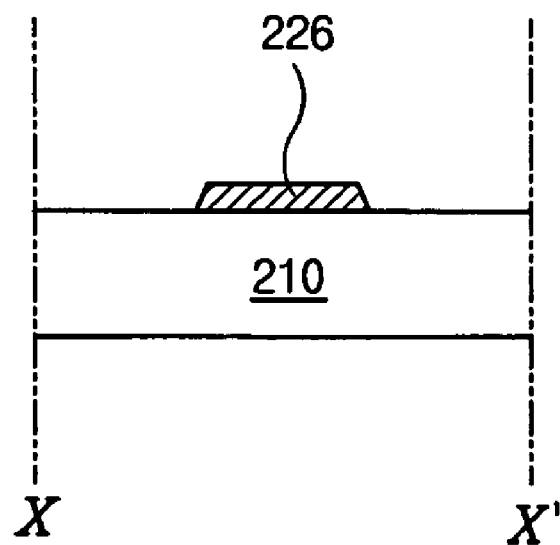
FIGS. 10A to 10E are cross-sectional views along the line X-X' of FIG. 7 and illustrating processes of fabricating an array-substrate for the dual panel type organic electroluminescent device according to the embodiment of the present invention.
Figure 10B:
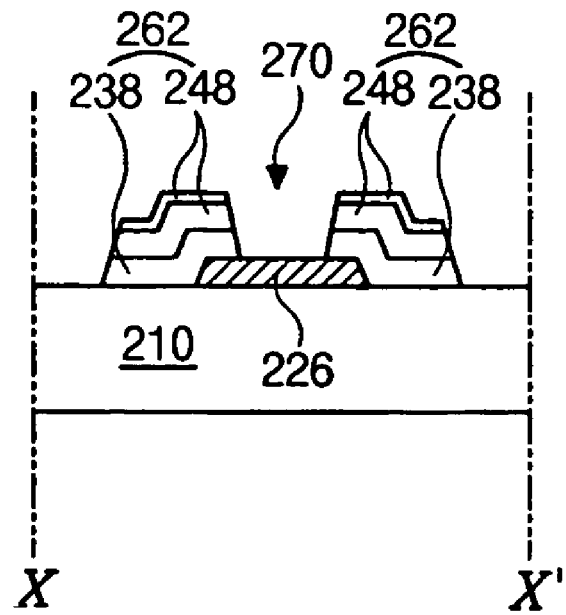
Figure 10C:
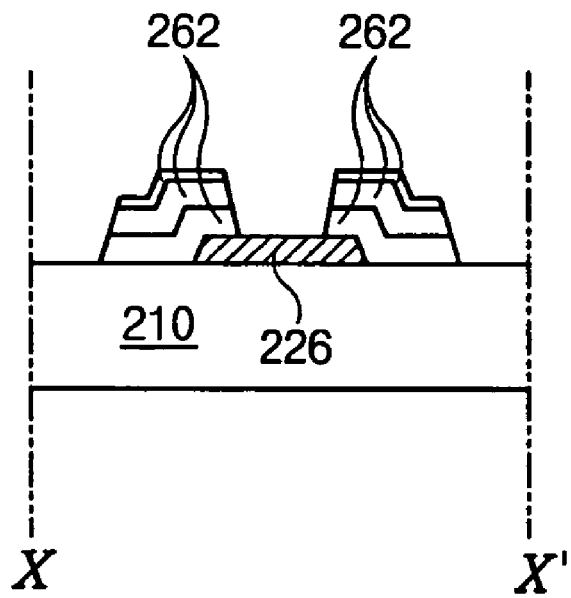
Figure 10D:
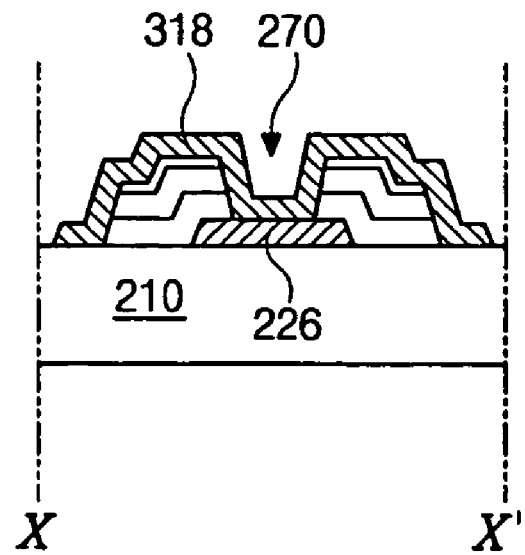
Figure 10E:
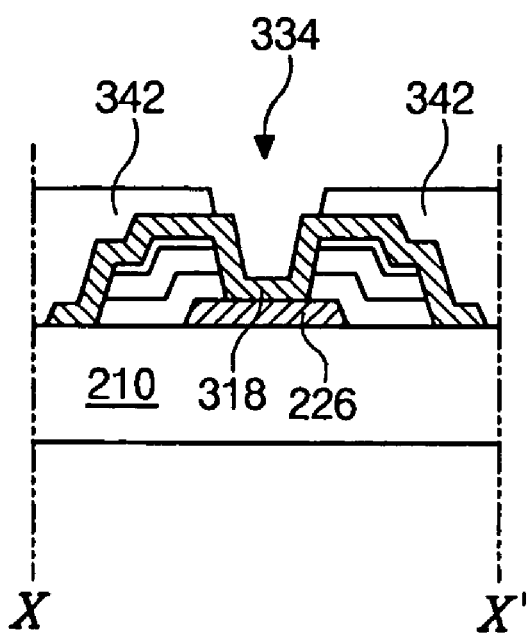
Figure 11A:
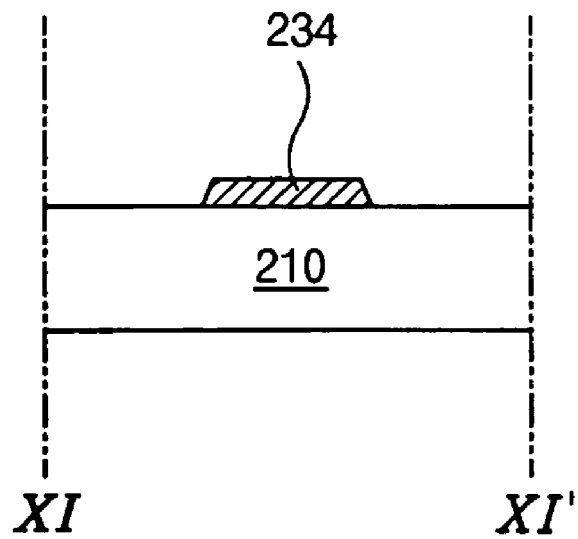
FIGS. 11A to 11E are cross-sectional views along the line XI-XI' of FIG. 7 and illustrating processes of fabricating an array substrate for the dual panel type organic electroluminescent device according to the embodiment of the present invention.
Figure 11B:
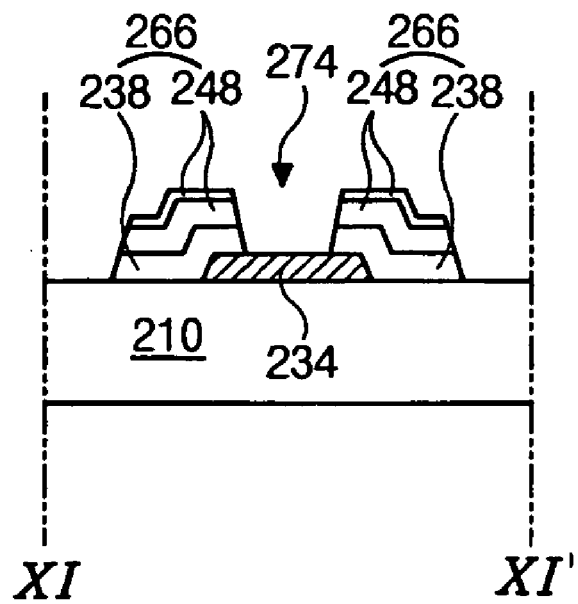
Figure 11C:
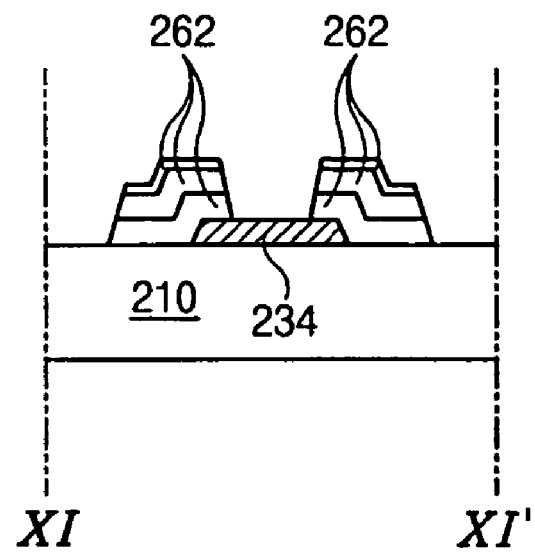
Figure 11D:
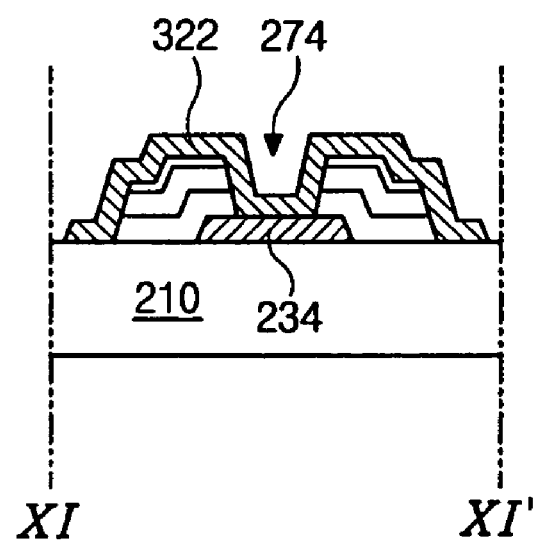
Figure 11E:
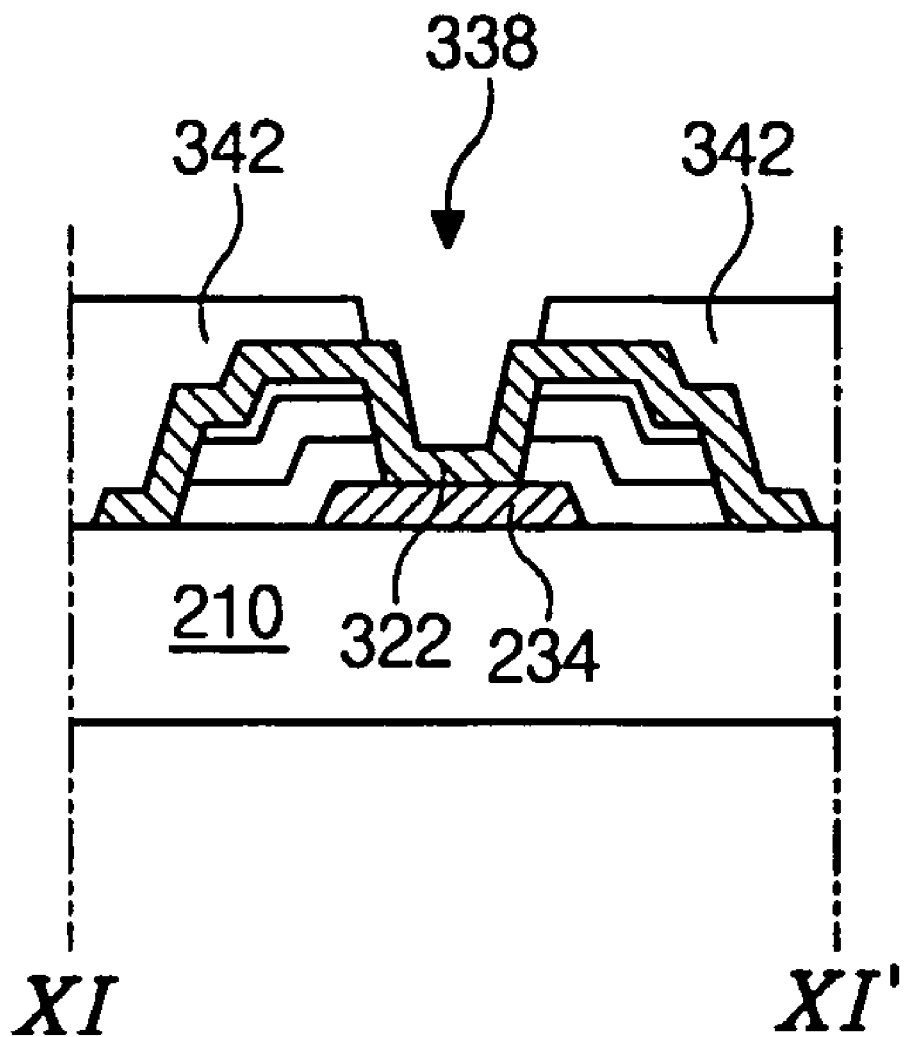

FIG. 7 is a plan view of an array substrate for a dual panel type organic electroluminescent device according to an embodiment of the present invention. As shown in FIG. 7, a gate line 214 is formed in a first direction and a data line 314 and a power supply line 230, which are spaced apart from each other, are formed in a second direction perpendicular to the first direction. A switching thin film transistor $T_S$ is formed adjacent to where gate line 214 and data line 314 cross each other. The switching thin film transistor $T_S$ has a first gate electrode 218, a first source electrode 282, a first drain electrode 290 and a first semiconductor layer 254. The first gate electrode 218 extends from the gate line 214 and the first source electrode 282 extends from the data line 314. The first drain electrode 290 is spaced apart from the first source electrode 282 and the first semiconductor layer 254 overlaps portions of the first gate electrode 218, the first source electrode 282 and the first drain electrode 290. In addition, a first gate insulating layer 250 is formed in a shape of a pattern corresponding to the first semiconductor layer 254. The power supply line 230 is formed simultaneously with the gate line 214 using the same material that is used to form the gate line 214.

As also shown in FIG. 7, a driving thin film transistor $T_D$ is electrically connected to the switching thin film transistor $T_S$ and the power supply line 230. The driving thin film transistor $T_D$ has a second gate electrode 222, a second source electrode 286, a second drain electrode 294 and a second semiconductor layer 258. The second gate electrode 222 is formed simultaneously with the gate line 214 using the same material that is used to form the gate line 214. The second source and drain electrodes 286 and 294 spaced apart from each other are formed simultaneously with the data line 314 using the same material that is used to form the data line 314. The second semiconductor layer 258 overlaps portions of the second gate electrode 222, the second source electrode 286 and the second drain electrode 294. In addition, a second gate insulating layer 251, which is made of the same material that is used to form the first gate insulating layer 250, is formed in a pattern shape corresponding to the second semiconductor layer 258.

A power electrode 232 extends from the power supply line 230 and is electrically connected to the second source electrode 286 via a power electrode contact hole 271. A connecting electrode 306, which extends from the second drain electrode 294, is formed in an electrical connecting region A. The electrical connecting region A corresponds to a second electrode of a substrate (not shown) having an organic electroluminescent diode (not shown). Although not shown in FIG. 7, an electrical connecting pattern having a columnar shape is formed in the electrical connecting region A. More detail with regard to the electrical connecting pattern (not shown) will be described later. A capacitor electrode 298, which overlaps the power supply line 230 and is connected to the first drain electrode 290, is formed under the power supply line 230. The capacitor electrode 298 and the power supply line 230 overlap each other to form a storage capacitor $C_{ST}$.

A gate pad 226, a data pad 310 and a power supply pad 234 are formed at ends of the gate line 214, the data line 314 and the power supply line 230, respectively. A gate pad electrode 318 and a power supply pad electrode 322, which are made simultaneously with the data line 314 using the same material that is used to form the data line 314, are formed over the gate pad 226 and the power supply pad 234, respectively. A first opening 326, a second opening 330, a third opening 334 and a fourth opening 338 are formed to expose portions of the connecting electrode 306, the data pad 310, the gate pad electrode 318 and the power supply pad electrode 322, respectively.

Because the gate line 214 and the power supply line 230 are formed during the same process using the same material, the gate and power supply lines 214 and 230 may short at a region where they are adjacent to one another. Accordingly, a power supply link line 316, which is formed simultaneously with the data line 314 using the same material that is used to form the data line 314 and is connected to the power supply pad electrode 322, connects the power supply line 230 to the power supply pad 234 at the intersection of the gate line 214 and the power supply line 230. Accordingly, a short between the gate line 214 and the power supply line 230 can be prevented. The power supply line 230 is connected to the power supply link line 316 via a power supply contact hole 272. Here, an insulating pattern 238 and a semiconductor layer 242 are subsequently formed corresponding to the power supply link line 316. Because different signals are separately applied to the data pad 310 and the power supply pad 234, the data pad 310 is preferably disposed at a position separate from the power supply pad 234.

FIGS. 8A to 8E, FIGS. 9A to 9E, FIGS. 10A to 10E and FIGS. 11A to 11E are cross-sectional views illustrating processes of fabricating an array substrate for the dual panel type organic electroluminescent device according to an embodiment of the present invention. FIGS. 8A to 8E correspond to cross-sections along the line VIII-VIII' of FIG. 7, FIGS. 9A to 9G correspond to cross-sections along the line IX-IX' of FIG. 7, FIGS. 10A to 10G correspond to cross-sections along the line X-X' of FIG. 7, and FIGS. 11A to 11G correspond to cross-sections along the line XI-XI' of FIG. 7. Although only the forming the driving thin film transistor $T_D$ will be explained in the process, the switching thin film transistor $T_S$ is also formed in the same process.

Referring to FIGS. 8A, 9A, 10A and 11A, a gate electrode 222, a gate pad 226, a power supply pad 234, and a power electrode 232 are formed on a substrate 210 with a first metal material using a first mask process. Although not shown in the figures, a power supply line connected to the power electrode 232 is also formed. The first metal material is selected from metal materials having a low specific resistance and preferably selected from metal materials including aluminum (Al). Although not shown in the figures, the masking process is performed as follows. That is, a photoresist, such as a photosensitive material, is coated on the substrate or a certain layer and then a mask having a desired pattern is disposed over the photoresist. The coated photoresist layer is exposed to light and then developed to form a photoresist pattern. Portions of the layer exposed by the photoresist pattern are etched away to obtain a desired pattern.

As referred to in FIGS. 8B, 9B, 10B and 11B, an insulating layer 238 and a semiconductor material layer 248 that includes a first semiconductor material layer 242 and a second semiconductor material layer 246 are formed by depositing or coating a first insulating material, amorphous silicon and doped amorphous silicon over the gate electrode 222, the gate pad 226, the power electrode 232 and the power supply pad 234, and a power contact hole 271. Then, a first pattern 262 and a second pattern 266 are formed by etching the insulating layer 238 and the semiconductor material layer 248 using a second mask process. The power contact hole 271 exposes a portion of the power electrode 232. The first pattern 262 covers the gate pad 226 and the second pattern 266 covers the power supply pad 234. The insulating layer 238 and the semiconductor material layer 248 disposed in a region B covering the gate electrode 222 become a gate insulating layer 251 and a semiconductor layer 258. The gate insulating layer 250 has the same shape as the semiconductor layer 258. Although not shown, the switching thin film transistor can also have a gate insulating layer having the same shape as the semiconductor layer since it is formed by the same process as the driving thin film transistor. In addition, a gate pad contact hole 270 and a power supply pad contact hole 274 are also formed in the first pattern 262 and the second pattern 266, respectively. The gate pad contact hole 262 exposes a portion of the gate pad 226 and the power supply pad contact hole 274 exposes a portion of the power supply pad 234.

The semiconductor layer 258 includes an active layer 258a formed of amorphous silicon (a-Si:H) and an ohmic contact layer 258b formed of impurity-doped amorphous silicon ($n^+$a-Si:H). Since the insulating material 238 and the semiconductor material layer 248 are subsequently etched using the same mask process, the first pattern 262 and the second pattern 266 have a layered structure of the insulating layer 238 and the semiconductor material layer 246. The first insulating material may be formed of insulating material including silicon, and desirably be formed of silicon nitride (SiNx), for example.

Referring to FIGS. 8C, 9C, 10C and 11C, a second insulating material is formed on the semiconductor layer 258, the first pattern 262 and the second pattern 266 and is patterned using a third mask process to form an electrical connecting pattern 278 in an electrical connecting region A. The electrical connecting pattern 278 may have a columnar shape and the second insulating material is preferably an organic insulating material so that the electrical connecting pattern 278 has a predetermined thickness. Preferably, the electrical connecting region A corresponds to a second electrode (not shown) of an organic electroluminescent diode (not shown).

Referring to FIGS. 8D, 9D, 10D and 11D, a source electrode 286, a drain electrode 294, a data pad 310, a gate pad electrode 318 and a power supply pad electrode 322 are formed by depositing a second metal material and patterning the material using a fourth mask process. The second metal material is selected from metal materials having a strong chemical corrosion-resistance and is preferably selected from molybdenum (Mo), titanium (Ti), chromium (Cr) and tungsten (W). The source and drain electrodes 286 and 294 are spaced apart from each other and positioned over the semiconductor layer 258. The data pad 310 is disposed at a data pad portion C. The gate pad electrode 318 is connected to the gate pad 226 through the gate pad contact hole 270. The power supply pad electrode 322 is connected to the power supply pad 234 via the power supply pad contact hole 274.

One side of the source electrode 286 is connected to the power electrode 232 through the power electrode contact hole 271. Simultaneously, a connecting electrode 306 can be formed during the formation of the drain electrode 294. The connecting electrode 306 extends from the drain electrode 294 and is disposed in the electrical connecting region A including an area covering the electrical connecting pattern 278. Although not shown in figures, a data line (not shown) is formed in a second direction with a data pad portion C at one end of the data line. The data pad portion C is preferably disposed at a position separate from the power supply pad 234.

Again referring to FIGS. 8D, 9D, 10D and 11D, a portion of the ohmic contact layer 258b between the source and drain electrodes 286 and 294 is removed to expose a portion of the active layer 258a. The exposed active layer 224a becomes a channel CH of the driving thin film transistor $T_D$. The gate electrode 222, the semiconductor layer 258, the source electrode 286 and the drain electrode 294 form a driving thin film transistor $T_D$. In the step forming the channel CH, the source electrode 286 connected to the power electrode 232 functions as a mask such that the second semiconductor material layer 246 of FIG. 8C that are not covered by the power electrode 232 is removed.

Referring to FIGS. 8E, 9E, 10E and 11E, a passivation layer 342 having first to fourth openings 326, 330, 334 and 338e is formed by depositing a third insulating material on the driving thin film transistor $T_D$, the connecting electrode 306, the gate pad electrode 318, and the power supply pad electrode 322. Then, the third insulating material is patterned using a fifth mask process. The first opening 326 exposes a portion of the connecting electrode 306, the second opening 330 exposes a portion of the data pad 310, the third opening 334 exposes a portion of the gate pad electrode 318, and the fourth opening 338 exposes a portion of the power supply pad electrode 322

The third insulating material may be selected from organic insulating materials or inorganic insulating materials. In addition, the second insulating material may be formed as a single layer or multiple layers. However, it is desirable to use inorganic insulating material for the passivation layer 342 contacting the driving thin film transistor $T_D$. Although not shown in the figures, the first opening 326 is for connecting a second electrode of an organic electroluminescent diode on another substrate to the connecting pattern 306, and the second, third and fourth openings 330, 334 and 338 are for connecting outer circuits to the data pad 310, the gate pad electrode 318, and the power supply pad electrode 322, respectively.

The dual panel type organic electroluminescent device according to embodiments of the present invention has at least the following advantages. First, because the array element layer having a thin film transistor and the organic electroluminescent diode are respectively formed on different substrates production yield and production management efficiency can be improved and thus a life cycle of products can be extended. Second, because the organic electroluminescent device according embodiments of the present invention is a top emission-type, a design of the thin film transistor can be replicated easily while maintaining a high aperture ratio such that a high resolution can be obtained. Third, because an inverse staggered type thin film transistor using amorphous silicon is adopted for all of the transistors in the organic electroluminescent device, the thin film transistors are formed at a lower temperature condition. Fourth, because gate patterns and power supply patterns are formed in the same mask process, a total number of required masks is reduced. Because the thin film transistors of the organic electroluminescent device can have the same design, the thin film transistor forming process can be simplified.

It will be apparent to those skilled in the art that various modifications and variations can be made in the fabrication and application of the present invention without departing from the spirit or scope of the invention. Thus, it is intended that the present invention cover the modifications and variations of this invention provided they come within the scope of the appended claims and their equivalents.

What is claimed is:

1. An organic electroluminescent device, comprising:
first and second substrates spaced apart from and facing each other;
an organic electroluminescent diode on an inner surface of the second substrate;
a gate line formed on an inner surface of the first substrate in a first direction;
a data line formed in a second direction crossing the first direction;
a power supply line spaced apart from the data line and formed in the second direction, the power supply line made of the same material and on the same layer as the gate line, the power supply line having a power supply link line near a crossing portion of the gate line and the power supply line;
a switching thin film transistor at a crossing portion of the gate and data lines, the switching thin film transistor including a first gate formed on the first substrate with a first semiconductor layer made of amorphous silicon formed over the first gate and electrically insulated from the first gate;
a driving thin film transistor at a crossing portion of the switching thin film transistor and the power supply line, the driving thin film transistor including a second gate formed on the first substrate with a second semiconductor layer made of amorphous silicon formed over the second gate and electrically insulated from the second gate;
a connecting electrode connected to the driving thin film transistor and made of the same material as the data line, the connecting electrode extending from a drain electrode of the driving thin film transistor; and
an electrical connecting pattern corresponding to the connecting electrode and for electrically connecting the connecting electrode to the organic electroluminescent diode, wherein the electrical connecting pattern is disposed directly on and contacts the first substrate, and top and side surfaces of the electrical connecting pattern directly contact the connecting electrode and are completely covered by the connecting electrode,
wherein the switching thin film transistor and the driving thin film transistor further include first and second gate insulating layers, respectively, the first gate insulating layer having the same shape as the first semiconductor layer, the second gate insulating layer having the same shape as the second semiconductor layer.

2. The device according to claim 1, further comprising a gate pad, a data pad and a power supply pad disposed at one end of the gate line, the data line and the power supply line, respectively.

3. The device according to claim 2, further comprising a gate pad electrode on the gate pad and a power supply pad electrode on the power supply pad, wherein the gate pad electrode and the power supply pad electrode are made of the same material as the data line.

4. The device according to claim 3, further comprising a first pattern between the gate pad and the gate pad electrode and a second pattern between the power supply pad and the power supply pad electrode.

5. The device according to claim 4, wherein each of the first and second patterns includes an insulating layer and a semiconductor material layer.

6. The device according to claim 5, wherein the first pattern has a gate pad contact hole exposing the gate pad such that the gate pad electrode contacts the gate pad through the gate pad contact hole and the second pattern has a power supply pad contact hole exposing the power supply pad such that the power supply pad electrode contacts the power supply pad through the power supply pad contact hole.

7. The device according to claim 3, further comprising a passivation layer on the gate pad electrode and the power supply pad electrode, wherein the passivation layer has first, second, third and fourth openings exposing the connecting electrode, the data pad, the gate pad electrode and the power supply pad electrode, respectively.

8. The device according to claim 1, wherein the switching thin film transistor further includes a first gate electrode, a first source electrode and a first drain electrode, the first gate electrode extended from the gate line, the first semiconductor layer formed over the first gate electrode and having an active layer made of amorphous silicon and an ohmic contact layer made of impurity-doped amorphous silicon, the first source and drain electrodes formed on the first semiconductor layer and spaced apart from each other.

9. The device according to claim 8, wherein the driving thin film transistor further includes a second gate electrode, a second source electrode and a second drain electrode, the second gate electrode connected to the first drain electrode, the second semiconductor layer formed over the second gate electrode and having an active layer made of amorphous silicon and an ohmic contact layer made of impurity-doped amorphous silicon, the second source and drain electrodes formed on the second semiconductor layer and spaced apart from each other.

10. The device according to claim 9, wherein the connecting electrode extends from the second drain electrode.

11. The device according to claim 9, further comprising a power electrode extending from the power supply line and connected to the second source electrode.

12. The device according to claim 1, wherein the power supply link line is formed of the same material as the data line in the same process as the data line.

13. The device according to claim 1, wherein ends of the first gate insulating layer are disposed on a same line as ends of the first semiconductor layer, and ends of the second gate insulating layer are disposed on a same line as ends of the second semiconductor layer.

14. The device according to claim 1, further comprising a seal pattern disposed between the first and second substrates outside a display region to attach the first and second substrates to one another.

15. The device according to claim 1, wherein the electrical connecting pattern maintains a space between the first and second substrates.

* * * * *